(12) United States Patent
Watkiss

(10) Patent No.: US 9,125,296 B2
(45) Date of Patent: Sep. 1, 2015

(54) ELECTRICAL HARNESS

(71) Applicant: ROLLS-ROYCE PLC, London (GB)

(72) Inventor: Jason Watkiss, Blaby (GB)

(73) Assignee: ROLLS-ROYCE plc, London (GB)

( * ) Notice: Subject to any disclaimer, the term of this patent is extended or adjusted under 35 U.S.C. 154(b) by 122 days.

(21) Appl. No.: 13/659,384

(22) Filed: Oct. 24, 2012

(65) Prior Publication Data

US 2013/0112474 A1 May 9, 2013

(30) Foreign Application Priority Data

Nov. 4, 2011 (GB) .................................. 1119046.9

(51) Int. Cl.
*H02G 3/04* (2006.01)
*H05K 1/02* (2006.01)
*F02C 7/00* (2006.01)
*F02C 7/32* (2006.01)

(52) U.S. Cl.
CPC .. *H05K 1/02* (2013.01); *F02C 7/00* (2013.01); *F02C 7/32* (2013.01)

(58) Field of Classification Search
CPC ..... H05K 1/02; H05K 1/0256; H05K 1/0254; H05K 1/024; H02H 1/04
See application file for complete search history.

(56) References Cited

U.S. PATENT DOCUMENTS

| | | | | |
|---|---|---|---|---|
| 3,612,744 A * | 10/1971 | Thomas | ........................... | 174/36 |
| 4,715,928 A | 12/1987 | Hamby | | |
| 5,126,507 A * | 6/1992 | Kirma | ............................... | 174/2 |
| 5,201,855 A * | 4/1993 | Ikola | ........................ | 439/607.14 |
| 5,682,124 A * | 10/1997 | Suski | ................................ | 333/1 |
| 6,969,807 B1 * | 11/2005 | Lin et al. | ..................... | 174/117 F |
| 7,709,741 B2 * | 5/2010 | Reichert et al. | ............. | 174/117 F |
| 2007/0230085 A1 * | 10/2007 | Le | .................................. | 361/212 |
| 2008/0230259 A1 | 9/2008 | Booth, Jr. et al. | | |

(Continued)

FOREIGN PATENT DOCUMENTS

| | | |
|---|---|---|
| EP | 2180769 A1 | 4/2010 |
| FR | 2922689 A1 | 4/2009 |

(Continued)

OTHER PUBLICATIONS

Ed Rupke, "Lightning Direct Effects Handbook", Mar. 1, 2002.*
IPC-2223, Nov. 1998.*

(Continued)

*Primary Examiner* — Adrian S Wilson
*Assistant Examiner* — Izak Baranowski
(74) *Attorney, Agent, or Firm* — Oliff PLC

(57) ABSTRACT

A gas turbine engine has an electrical harness formed from a flexible printed circuit board which provides a plurality of spaced conductive tracks. The conductive tracks are grouped into plural layers of tracks, the track layers being spaced apart and extending substantially parallel to each other. The tracks of each track layer form respective circuits which all have impedances lying within a respective range for that track layer. The impedances ranges are non-overlapping. The highest voltage differentials between tracks produced during indirect lightning strikes will thus tend to be between tracks of different track layers rather than between tracks of the same track layer.

12 Claims, 4 Drawing Sheets

(56) References Cited

U.S. PATENT DOCUMENTS

| | | | |
|---|---|---|---|
| 2009/0114427 A1 | 5/2009 | Feider et al. | |
| 2009/0133906 A1 | 5/2009 | Baek | |
| 2009/0260860 A1 | 10/2009 | Pai et al. | |
| 2010/0206986 A1* | 8/2010 | Gallant et al. | 244/119 |
| 2010/0258338 A1 | 10/2010 | Hsu | |
| 2013/0258541 A1* | 10/2013 | Knobloch et al. | 361/111 |

FOREIGN PATENT DOCUMENTS

| | | |
|---|---|---|
| GB | 2463867 A | 3/2010 |
| WO | WO 03/088356 A1 | 10/2003 |

OTHER PUBLICATIONS

Epectec "Flex & Rigid-Flex PCBs" Jun. 19, 2010.*

Roy Langton, Chuck Clark, Martin Hewitt and Lonnie Richards, Aircraft Fuel Systems, 2009 John Wiley & Sons, Ltd. ISBN: 978-0-470-05708-7 Chapter 9.*

Mar. 27, 2013 Search Report issued in British Application No. 1219087.2.

Mar. 2, 2012 British Search Report issued in British Patent Application No. GB1119046.9.

Feb. 1, 2013 European Search Report issued in European Patent Application No. 12189701.

* cited by examiner

ELECTRICAL HARNESS

CROSS-REFERENCE TO RELATED APPLICATIONS

This application is based upon and claims the benefit of priority from British Patent Application Number 1119046.9 filed 4 Nov. 2011, the entire contents of which are incorporated by reference.

FIELD OF THE INVENTION

The present invention relates to an electrical harness formed from a flexible printed circuit board.

BACKGROUND OF THE INVENTION

With reference to FIG. 1, a ducted fan gas turbine engine generally indicated at 10 has a principal and rotational axis X-X. The engine comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. A nacelle 21 generally surrounds the engine 10 and defines the intake 11, a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines respectively drive the high and intermediate pressure compressors 14, 13 and the fan 12 by suitable interconnecting shafts.

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power and signals to and from the individual electrical components are commonly transmitted along conductors. Conventionally, such conductors may be in the form of wires and cables which are assembled together in a harness. In such a conventional harness, each wire may be surrounded by an insulating sleeve. The connections between the individual components and the conventional harness are made, for example, by multi-pin plug and socket connectors. Similarly, communication between the harness and power, control and signalling circuitry is achieved through a multi-pin connector.

By way of example, FIG. 2 of the accompanying drawings shows a typical gas turbine engine including two conventional wiring harnesses 102, 104, each provided with a respective connector component 106, 108 for connection to circuitry accommodated within the airframe of an aircraft in which the engine is installed.

The harnesses 102, 104 are assembled from individual wires and cables which are held together over at least part of their lengths by suitable sleeving or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 therefore comprises a multitude of insulated wires and cables. This makes the conventional harness bulky, heavy and difficult to manipulate. It is desirable to reduce the size and weight of components on gas turbine engines, particularly, for example, gas turbine engines for use on vehicles, such as aircraft.

It is proposed to replace conventional harnesses with flexible printed circuit board harnesses (FPCB harnesses). An example of a portion of a flexible printed circuit board harness 120 is shown in FIGS. 3 to 6. FIG. 3 shows a perspective view of an FPCB harness portion, and FIGS. 4, 5, and 6 show side, top, and cross-sectional views respectively.

The FPCB harness 120 typically comprises a flexible (for example elastically deformable) substrate 140 with conductive tracks 130 laid/formed therein. The FPCB harness 120 may thus be deformable. In the example shown in FIGS. 3 to 6, the FPCB harness 120 extends along a length in the x-direction, a width in the y-direction, and a thickness (or height or depth) in the z-direction. The x direction may be defined as the axial direction of the FPCB harness. Thus, the x-direction (and thus the z-direction) may change along the length of the FPCB harness 20 as the FPCB harness is deformed. The x-y surface(s) may be said to be the major surface(s) of the FPCB harness. In the example shown in FIGS. 3 to 6, the FPCB harness is deformable in the z direction, i.e. in a direction perpendicular to the major surface. FPCB harnesses may be additionally of alternatively deformable about any other direction, and/or may be twisted about any one or more of the x, y, or z directions.

The flexible substrate 140 is typically a dielectric, and the conductive tracks 130, which may be surrounded by the substrate, are typically formed using a suitable conductive material. The conductive tracks 130 may be used to conduct/transfer electrical signals and/or electrical power, for example around a gas turbine engine and/or to/from components of a gas turbine engine. The size (for example the cross-sectional area) and/or the shape of the conductive tracks 130 can depend on the signal to be transmitted through the particular conductive track 130. Thus, the shape and/or size of the individual conductive tracks 130 may or may not be uniform in a FPCB harness 120.

The example shown in FIGS. 3 to 6 has two layers of conductive tracks 130 running through the substrate 140, with three tracks in each layer. However, the number of layers and the number of tracks in the FPCB harness 120 can vary.

Using an FPCB harness to transmit electrical signals and/or power can be advantageous over a conventional harness, for example because of its reduced size, weight and/or complexity.

A lightning strike on an aircraft causes current to pass through the exterior skin and structures of the aircraft. This current can induce transients, known as indirect lightning, in components such as FPCB harnesses. For example, a 200 kA direct lightning strike on an engine can induce up to about 1500 V (overvoltage) to a harness. This can result in high voltage differentials between tracks which may produce damage in the harness.

IPC gives standard track spacing rules (see IPC 2223B, May 2008, Sectional Design Standards for Flexible Printed Circuit Boards, Section 6.3 (electrical clearances)) between tracks of FPCBs to account for normal conditions, but excludes indirect lightning strikes. In particular, IPC 2223B gives a table of electrical voltages against spacing distances. According to this table, above a 500 V differential the distance between tracks increases significantly. Thus, following IPC standard spacing rules in an FPCB harness which may have to accommodate a potential voltage differential of 1500 V during indirect lightning strikes can lead to the spacing between conductors becoming large, with the result that the harness may become unfeasibly large, heavy and/or expensive.

OBJECTS AND SUMMARY OF THE INVENTION

It would be desirable for an electrical harness formed from a flexible printed circuit board to be capable of accommodating indirect lightning strike overvoltages, while avoiding excessive additional size, weight and cost.

Accordingly, in a first aspect, the present invention provides a gas turbine engine having an electrical harness formed from a flexible printed circuit board which provides a plurality of spaced conductive tracks, wherein:

the conductive tracks are grouped into plural layers of tracks, the track layers being spaced apart and extending substantially parallel to each other, the tracks of each track layer forming respective circuits which all have impedances lying within a respective range for that track layer, and the impedances ranges being non-overlapping.

Advantageously, by ensuring that the track layers relate to respective and non-overlapping impedance ranges, the highest voltage differentials between tracks produced during indirect lightning strikes will tend to be between tracks of different track layers rather than between tracks of the same track layer. The voltage differentials are then consistent with the dielectric strength of the harness material, which tends to be relatively high between track layers but relatively low between tracks of a given track layer. Spacings between tracks of a given track layer do not then have to be increased to withstand e.g. a 1500 V voltage differential.

In a second aspect, the present invention provides the use (e.g. in a gas turbine engine) of an electrical harness formed from a flexible printed circuit board for avoiding excessive induced voltage differentials during indirect lightning strikes between spaced conductive tracks grouped into respective layers of tracks of the circuit board, the track layers being spaced apart and extending substantially parallel to each other, the tracks of each track layer forming respective circuits which all have impedances lying within a respective range for that layer, and the impedances ranges being non-overlapping.

Optional features of the invention will now be set out. These are applicable singly or in any combination with any aspect of the invention.

Typically, the harness has one or more harness connectors at respective terminating regions of the flexible printed circuit board joining the harness to complementary connectors of the engine.

The flexible printed circuit board may provide a first track layer and a second track layer, the tracks of the first track layer all forming relatively low impedance circuits, and the tracks of the second track layer all forming relatively high impedance circuits.

The low impedance circuits can be circuits that are protected directly or indirectly to ground. The low impedance circuits can be circuits that have an impedance of less than 10 Ohms when subjected to lightning strike indirect waveforms at all frequencies below 10 kHz (the indirect lightning strike indirect waveforms can be those defined in RTCA/DO-160 Section 22 as Waveform 2, Waveform 3, Waveform 4, and Waveform 5).

The high impedance circuits can be circuits that are not protected directly or indirectly to ground. The high impedance circuits can be circuits that have an impedance of greater than 100 Ohms when subjected to lightning strike indirect waveforms at all frequencies below 10 kHz (the indirect lightning strike indirect waveforms can be those defined in RTCA/DO-160 Section 22 as Waveform 2, Waveform 3, Waveform 4, and Waveform 5).

All the conductive tracks of the flexible printed circuit board may be grouped into either the first track layer or the second track layer, i.e. the flexible printed circuit board may have only two track layers.

Alternatively, however, the conductive tracks may be grouped into the first track layer, the second track layer, and a third track layer. The first, the second and the third track layers are then spaced apart and extend substantially parallel to each other, and the tracks of the third track layer form intermediate impedance circuits having impedances greater than the low impedance circuits but lower than the high impedance circuits. The intermediate impedance circuits can have impedances of from 10 to 100 Ohms when subjected to lightning strike indirect waveforms at all frequencies below 10 kHz (the indirect lightning strike indirect waveforms can be those defined in RTCA/DO-160 Section 22 as Waveform 2, Waveform 3, Waveform 4, and Waveform 5). For example, circuits that contain ground referenced solenoids typically have an impedance of 30 to 40 Ohms. All the conductive tracks of the flexible printed circuit board may be grouped into the first, the second or the third track layer, i.e. the flexible printed circuit board may have only three track layers.

The flexible printed circuit board may have respective dielectric layers between adjacent track layers, the or each dielectric layer being configured to withstand a differential voltage between the adjacent track layers of at least 1500 V, and preferably of at least 2000 V. Such a dielectric layer can be formed, for example, of polyimide.

Each track layer may be configured to withstand a differential voltage of at most 1500 V, preferably at most 1000 V and more preferably at most 500 V, between adjacent tracks of that track layer. As higher dielectric capabilities between adjacent tracks can add size, weight and cost to the flexible printed circuit board, there is an incentive to reduce the upper limit of the dielectric capability between adjacent tracks. However, as induced lightning strikes can induce potential voltage differentials of around 50-100 V even between adjacent tracks forming circuits of approximately equal impedance, each track layer may be configured to withstand a differential voltage of at least 200 V, and preferably at least 400 V, between adjacent tracks of the respective layer.

Each track layer may have at least four tracks, and preferably may have at least six or eight tracks.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
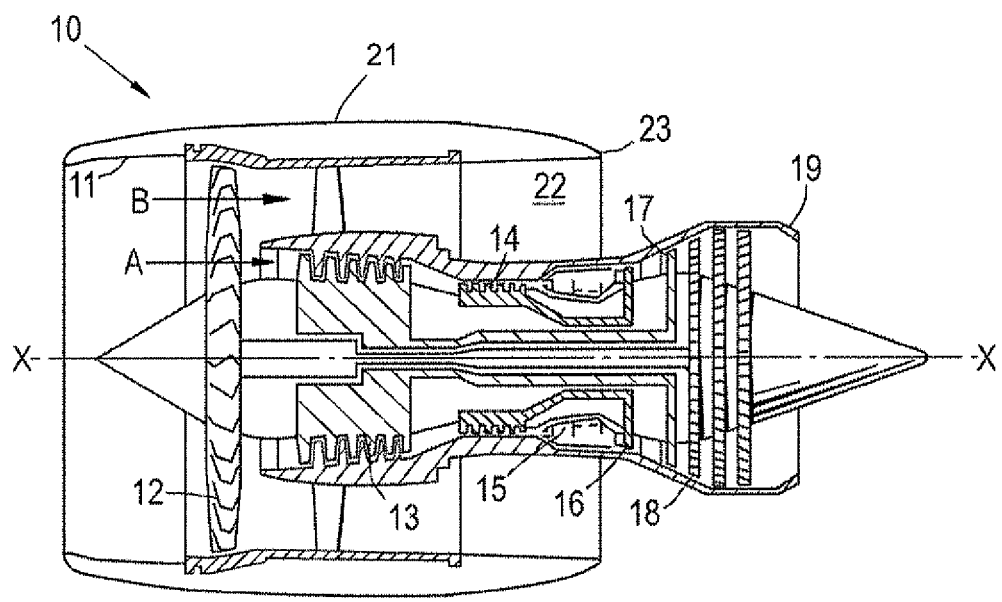
FIG. 1 shows a schematic longitudinal cross-sectional view through a ducted fan gas turbine engine.
Figure 2:
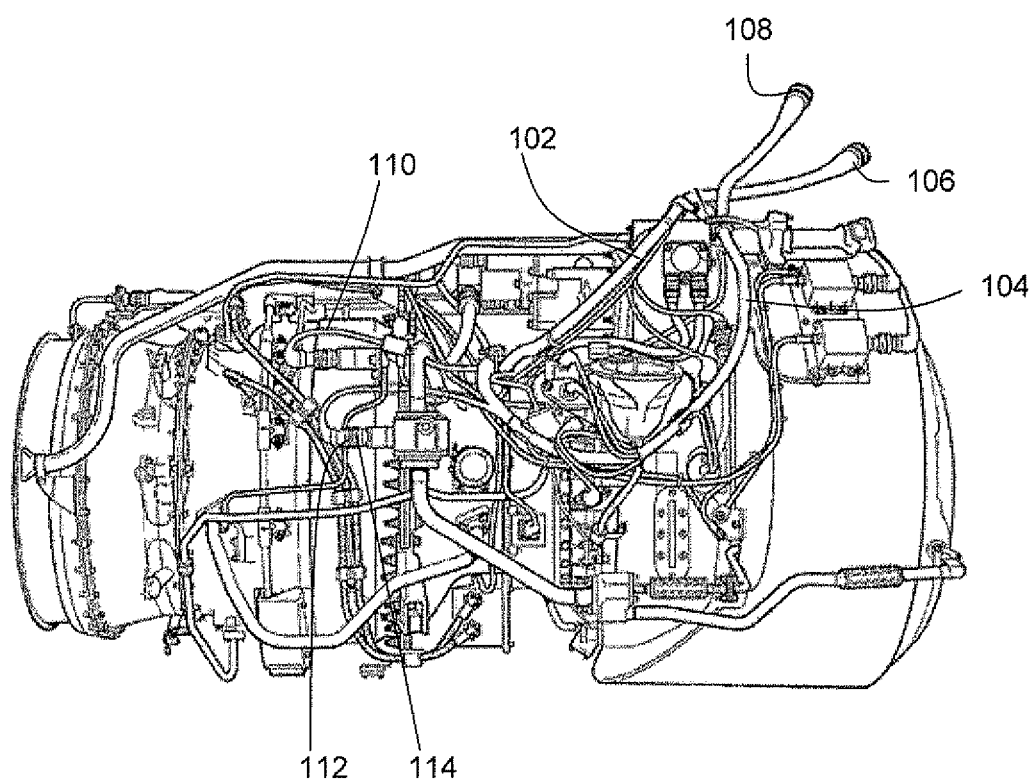
FIG. 2 shows a gas turbine engine with a conventional harness.
Figure 3:
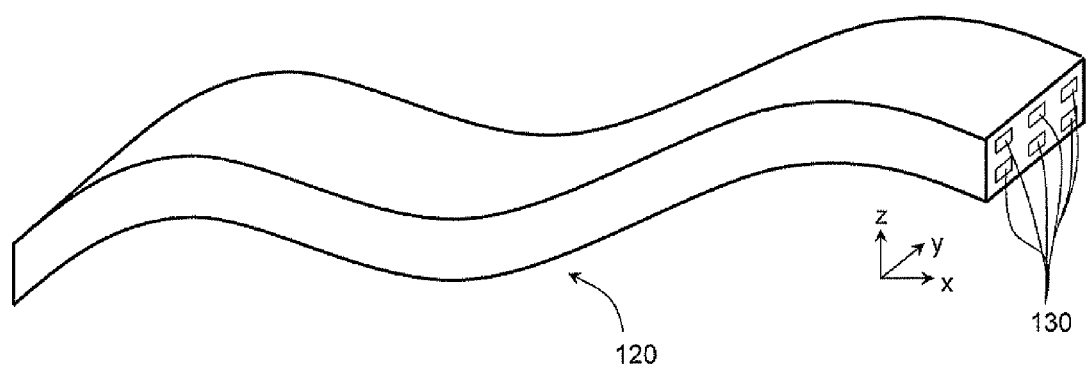
FIG. 3 shows a schematic perspective view of a portion of a flexible printed circuit board harness.
Figure 4:
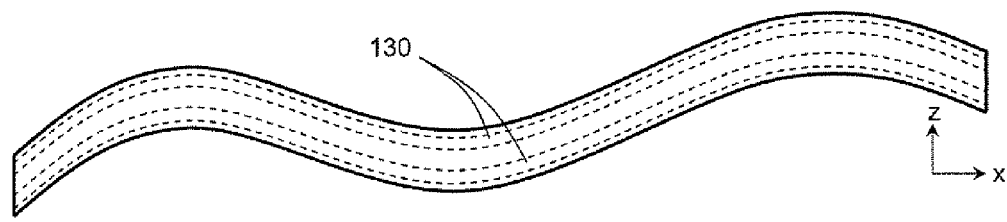
FIG. 4 shows a side view of the flexible printed circuit board harness of FIG. 3.
Figure 5:
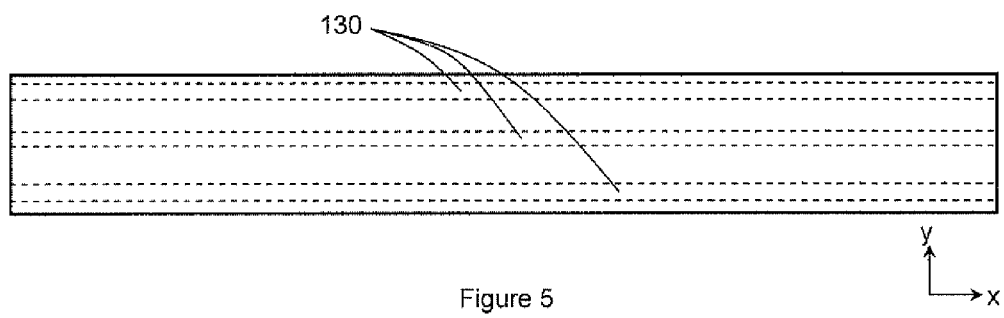
FIG. 5 shows a top view of the flexible printed circuit board harness of FIG. 3.
Figure 6:
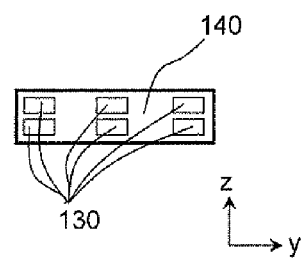
FIG. 6 shows a transverse cross-sectional view of the flexible printed circuit board harness of FIG. 3.
Figure 7:
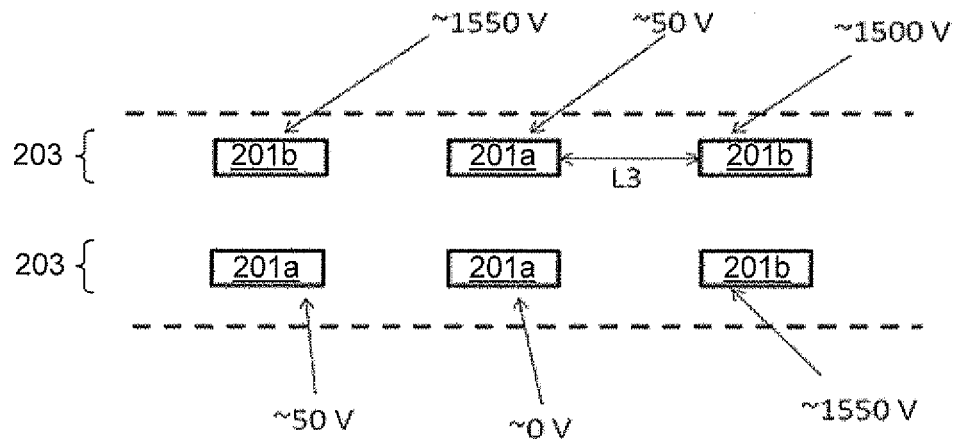
FIG. 7 shows schematically an arrangement of conductive tracks in a transverse cross-section through an electrical harness formed from a flexible printed circuit board in which the tracks are in two layers.

FIG. 7 shows schematically an arrangement of conductive copper tracks 201a, 201b in a transverse cross-section through an electrical harness formed from a flexible printed circuit board in which the tracks are in two track layers 203. The tracks are not grouped according to the relative impedances of the circuits which they form. Thus, during an indirect lightning strike, high voltage differentials can be induced between adjacent tracks of the same track layer. In particular, tracks 201a forming low impedance circuits, which are typically protected directly or indirectly to ground, remain at or close to ground potential, while tracks 201b forming high impedance circuits, which are typically allowed to "float" above ground, reach potentials of around 1500 V.

The distance L3 between adjacent tracks of the same track layer thus has to be relatively large to accommodate a potential difference of around 1500 V.

Figure 8:
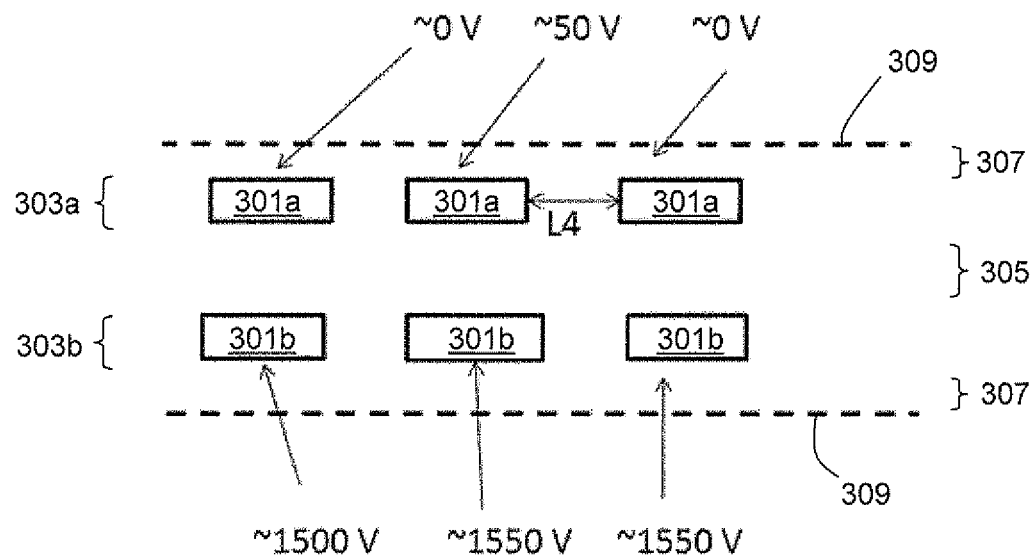
FIG. 8 shows schematically a corresponding arrangement of conductive tracks in a transverse cross-section through an electrical harness formed from a flexible printed circuit board, but with the tracks being grouped into the layers according to the relative impedances of the circuits which the tracks form.

In contrast, FIG. 8 shows schematically a corresponding arrangement of conductive copper tracks 301a, 301b, grouped into two track layers 303a, 303b according to the relative impedances of the circuits which the tracks form. Thus, the tracks 301a forming low impedance circuits are all in the top track layer 303a, while the tracks 301b forming high impedance circuits are all in the bottom track layer 303b. In this way, although the potential difference between tracks of different track layers during an indirect lightning strike can still reach around 1500 V, within a given track layer the maximum potential difference between adjacent tracks is much lower (around 50 V as shown). Thus the distance L4 between adjacent tracks of the same track layer can be much lower, allowing the flexible printed circuit board to be more compact, lighter and cheaper than that of FIG. 7.

Between the top 303a and the bottom 303b track layers is a centre layer 305 of dielectric material formed from e.g. polyimide, which has a high dielectric strength in the order of 3 to 5 kV/μm. This dielectric layer is able to withstand differential voltages between the top and bottom track layers of at least 1500 V.

Copper screen layers 309 form the outer surfaces of the flexible printed circuit board and provide a low impedance path for the indirect lightning current. Each copper screen layer is separated from the track layers 303a, 303b by a respective outer layer 307 of dielectric material.

The spaces between neighbouring tracks 301a, 301b of a given track layer 303a, 303b are filled with dielectric material in direct contact with the dielectric centre layer 305 and the respective dielectric outer layer 307.

While the invention has been described in conjunction with the exemplary embodiments described above, many equivalent modifications and variations will be apparent to those skilled in the art when given this disclosure. Thus the flexible printed circuit board may provide three or more track layers relating to respective and non-overlapping impedance ranges. For example, a board providing three track layers may have first and second (e.g. top and bottom) track layers containing tracks forming respectively low impedance circuits and high impedance circuits, and a third (e.g. central) track layer containing tracks forming intermediate impedance circuits. In this way, the maximum potential difference between adjacent tracks of a given track layer can still be kept lower during an indirect lightning strike than the maximum potential difference between adjacent track layers.

Figure 9:
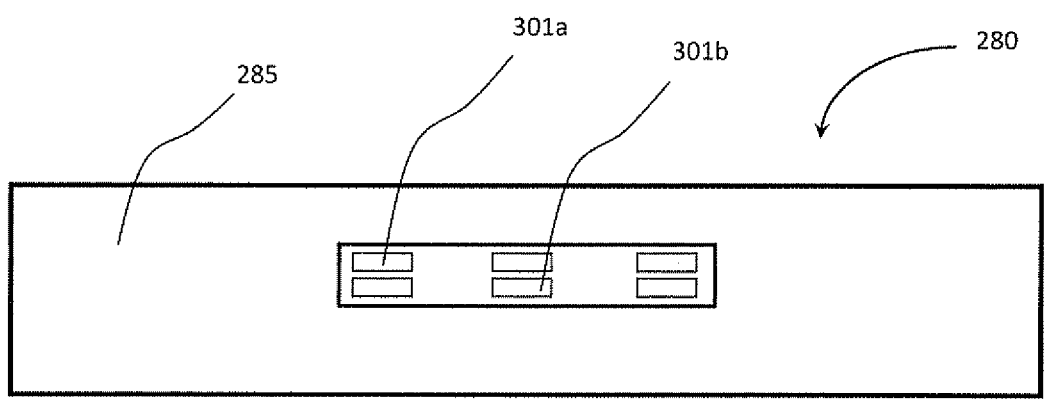
FIG. 9 shows a diagrammatic representation of a flexible printed circuit board embedded in a rigid material.

By way of further example, at least a part of the flexible printed circuit board may be embedded in a rigid material 285, as shown in FIG. 9 by way of example. For example, along at least a part of its length, the flexible printed circuit board may be fixed inside a rigid material to form a rigid structure 280, which may be referred to as a rigid raft 280. Thus, the electrical harness may comprise rigid structure through which the flexible printed circuit board runs. Such a rigid structure may be readily mounted on or fixed to another component, for example a gas turbine engine.

The rigid material 285 may be, for example, a composite material of fibre and filler, such as carbon fibre. Any suitable method may be used to manufacture such a rigid structure 280 such as, for example, placing the flexible printed circuit board between flexible layers of a composite material (or "laying-up" the flexible composite material), and then moulding to the desired shape and treating (for example heat and/or pressure treating) to form a rigid composite structure.

Accordingly, the exemplary embodiments of the invention set forth above are considered to be illustrative and not limiting. Various changes to the described embodiments may be made without departing from the spirit and scope of the invention.

All references referred to above are hereby incorporated by reference.

I claim:

1. A gas turbine engine having an electrical harness formed from a flexible printed circuit board which provides a plurality of spaced conductive tracks, wherein: the conductive tracks are grouped into plural layers of tracks, the track layers being spaced apart and extending substantially parallel to each other, the tracks of each track layer forming respective circuits which all have impedances lying within a respective range for a respective track layer, and the impedance ranges being non-overlapping, wherein the plural layers of tracks comprises a first track layer and a second track layer, the tracks of the first track layer all forming relatively low impedance circuits, and the tracks of the second track layer all forming relatively high impedance circuits compared to the tracks of the first track layer, and the high impedance circuits are circuits that are not protected directly or indirectly to ground.

2. A gas turbine engine according to claim 1, wherein the low impedance circuits are circuits that are protected directly or indirectly to ground.

3. A gas turbine engine according to claim 1, wherein all the conductive tracks of the flexible printed circuit board are grouped into one of the first track layer or the second track layer.

4. A gas turbine engine according to claim 1, wherein the conductive tracks are grouped into the first track layer, the second track layer, and a third track layer, the first, the second and the third track layers being spaced apart and extending substantially parallel to each other, and the tracks of the third track layer forming intermediate impedance circuits having impedances greater than the relatively low impedance circuits and lower than the relatively high impedance circuits.

5. A gas turbine engine according to claim 4, wherein the intermediate impedance circuits have at least one of (i) impedances of from 10 to 100 Ohms when subjected to lightning strike indirect waveforms at all frequencies below 10 kHz, and (ii) all the conductive tracks of the flexible printed circuit board grouped into the first track layer, the second track layer or the third track layer.

6. An electrical harness according to claim 1, wherein a part of the flexible printed circuit board is embedded in a rigid material, wherein the rigid material is a rigid composite material.

7. A gas turbine engine according to claim 1, wherein the flexible printed circuit board has respective dielectric layers between adjacent track layers, the one or more dielectric layers being configured to withstand a differential voltage between the adjacent track layers of at least 1500 V.

8. A gas turbine engine according to claim 1, wherein each track layer is configured to withstand a differential voltage of at most 1500 V between adjacent tracks of that track layer.

9. A gas turbine engine according to claim 1, wherein each track layer is configured to withstand a differential voltage of at least 200 V between adjacent tracks of that track layer.

10. A gas turbine engine according to claim 1, wherein each track layer has at least four tracks.

11. A gas turbine engine having an electrical harness formed from a flexible printed circuit board which provides a plurality of spaced conductive tracks, wherein: the conductive tracks are grouped into plural layers of tracks, the track layers being spaced apart and extending substantially parallel to each other, the tracks of each track layer forming respective circuits which all have impedances lying within a respective range for a respective track layer, and the impedance ranges being non-overlapping, wherein the plural layers of tracks comprise a first track layer and a second track layer, the tracks of the first track layer all forming relatively low impedance circuits, and the tracks of the second track layer all forming relatively high impedance circuits compared to the tracks of the first track layer, and the low impedance circuits have an impedance of less than 10 Ohms when subjected to lightning strike indirect waveforms at all frequencies below 10 kHz.

12. A gas turbine engine having an electrical harness formed from a flexible printed circuit board which provides a plurality of spaced conductive tracks, wherein: the conductive tracks are grouped into plural layers of tracks, the track layers being spaced apart and extending substantially parallel to each other, the tracks of each track layer forming respective circuits which all have impedances lying within a respective range for a respective track layer, and the impedance ranges being non-overlapping, wherein the plural layers of tracks comprise a first track layer and a second track layer, the tracks of the first track layer all forming relatively low impedance circuits, and the tracks of the second track layer all forming relatively high impedance circuits compared to the tracks of the first track layer, and the high impedance circuits have an impedance of greater than 100 Ohms when subjected to lightning strike indirect waveforms at all frequencies below 10 kHz.

\* \* \* \* \*